(12) United States Patent
Lee et al.

(10) Patent No.: US 10,679,703 B2
(45) Date of Patent: Jun. 9, 2020

(54) STORAGE DEVICE AND DATA RETENTION METHOD THEREOF

(71) Applicant: SK hynix Inc., Gyeonggi-do (KR)

(72) Inventors: Dong Uk Lee, Chungcheongbuk-do (KR); Se Chang Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/234,719

(22) Filed: Dec. 28, 2018

(65) Prior Publication Data

US 2019/0392901 A1 Dec. 26, 2019

(30) Foreign Application Priority Data

Jun. 20, 2018 (KR) .................. 10-2018-0071091

(51) Int. Cl.
| | |
|---|---|
| *G11C 16/10* | (2006.01) |
| *G11C 16/04* | (2006.01) |
| *G11C 16/14* | (2006.01) |
| *G11C 16/26* | (2006.01) |
| *G11C 16/24* | (2006.01) |
| *G11C 16/08* | (2006.01) |
| *G11C 11/56* | (2006.01) |

(52) U.S. Cl.
CPC .......... *G11C 16/10* (2013.01); *G11C 16/0483* (2013.01); *G11C 16/08* (2013.01); *G11C 16/14* (2013.01); *G11C 16/24* (2013.01); *G11C 16/26* (2013.01); *G11C 11/5628* (2013.01); *G11C 11/5635* (2013.01); *G11C 11/5642* (2013.01); *G11C 11/5671* (2013.01)

(58) Field of Classification Search
CPC ..... G11C 16/10; G11C 16/0483; G11C 16/26; G11C 16/24; G11C 16/08; G11C 16/14; G11C 11/5628; G11C 11/5642; G11C 11/5635; G11C 11/5671
See application file for complete search history.

(56) References Cited

U.S. PATENT DOCUMENTS

| | | | |
|---|---|---|---|
| 9,299,419 B1 * | 3/2016 | Singh | G11C 5/005 |
| 2015/0092477 A1 * | 4/2015 | Chiou | G11C 11/417 |
| | | | 365/154 |
| 2016/0111164 A1 * | 4/2016 | Chen | G11C 16/14 |
| | | | 365/185.11 |

FOREIGN PATENT DOCUMENTS

| | | |
|---|---|---|
| KR | 1020170038504 | 4/2017 |
| KR | 1020170041510 | 4/2017 |

* cited by examiner

*Primary Examiner* — Ajay Ojha
(74) *Attorney, Agent, or Firm* — IP & T Group LLP

(57) ABSTRACT

The present disclosure relates to an electronic device. A storage device having improved reliability may include a memory device performing a program operation of storing data in selected memory cells, among a plurality of memory cells included in a memory block, and a memory controller controlling the memory device to perform a retention control operation of applying a retention control voltage to at least one source line coupled to a plurality of memory cell strings included in the memory block for a predetermined time duration when the program operation is completed.

17 Claims, 16 Drawing Sheets

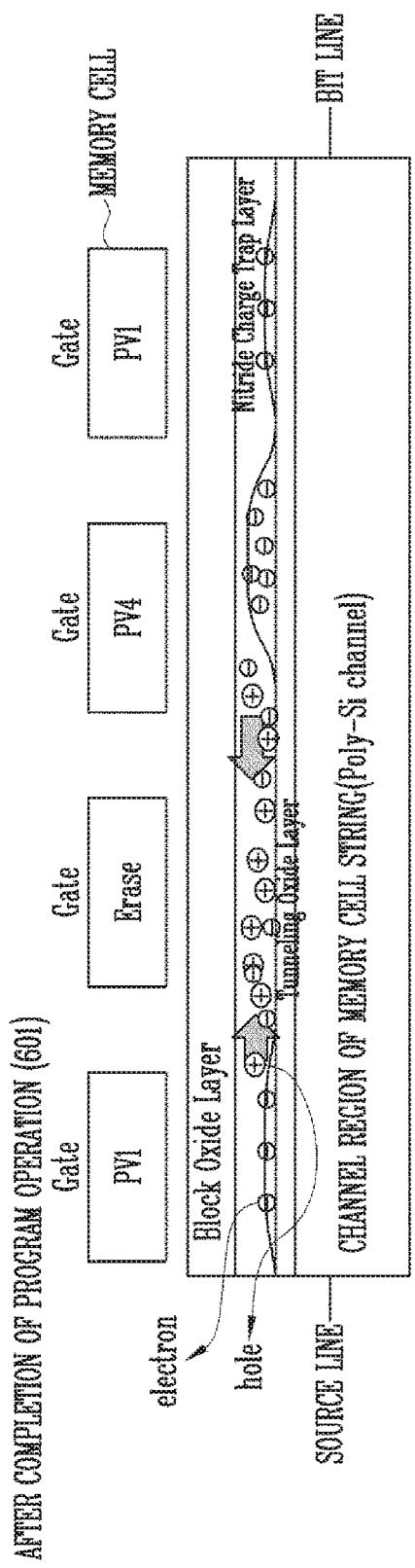
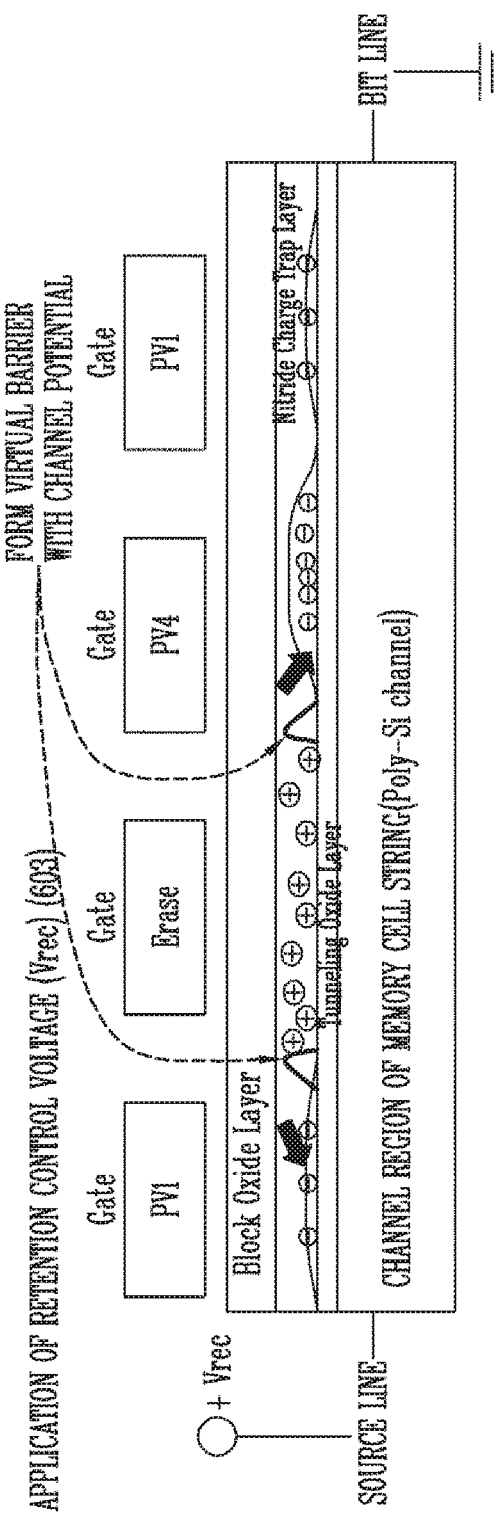

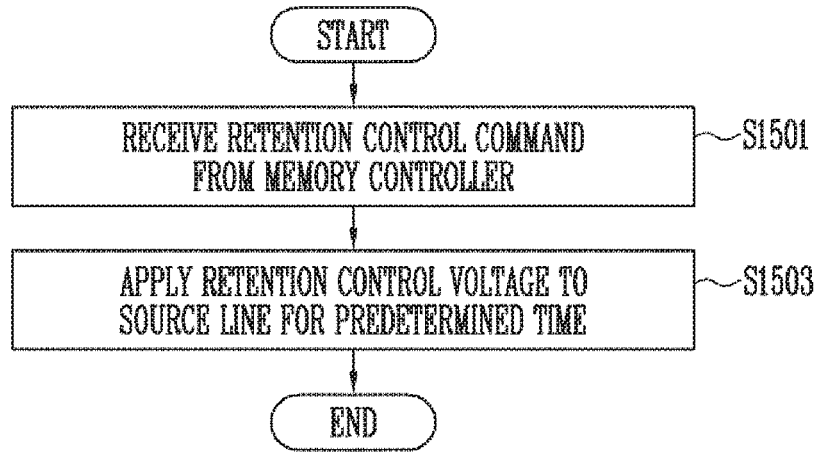
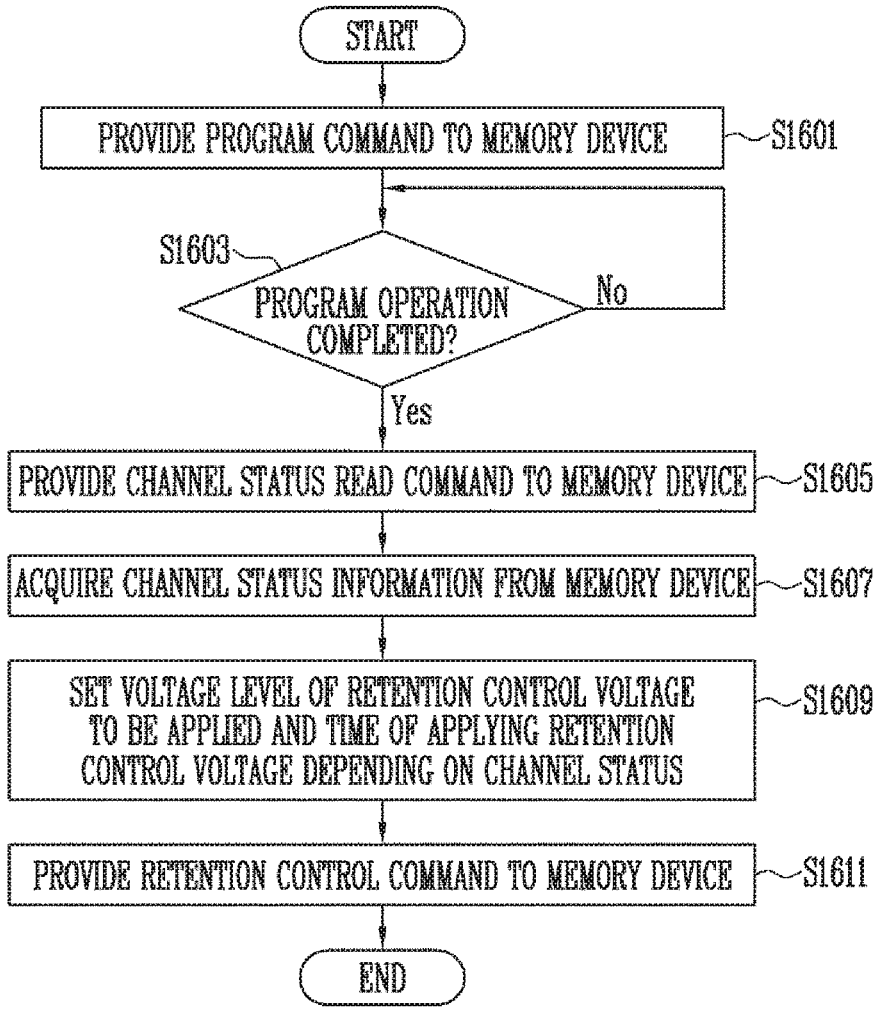

STORAGE DEVICE AND DATA RETENTION METHOD THEREOF

CROSS-REFERENCE TO RELATED APPLICATION

The present application claims priority under 35 U.S.C. § 119(a) to Korean patent application number 10-2018-0071091, filed on Jun. 20, 2018, the entire disclosure of which is incorporated herein by reference in its entirety.

BACKGROUND

1. Field of Invention

Various embodiments of the present invention generally relate to an electronic device. Particularly, the embodiments relate to a storage device and an operating method thereof.

2. Description of Related Art

A storage device may store data in response to control of a host device such as a computer, a smartphone, and a smartpad. Examples of the storage device may include a device for storing data in a magnetic disk, such as a hard disk drive (HDD), and a device for storing data in a semiconductor memory, especially in a nonvolatile memory, such as a solid state drive (SSD) or a memory card.

A storage device may include a memory device storing data and a memory controller controlling the memory device. A memory device may be classified into a volatile memory and a nonvolatile memory. Examples of the nonvolatile memory may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

SUMMARY

Various embodiments are directed to a storage device including a memory device having improved reliability and an operating method thereof.

According to an embodiment, a storage device may include a memory device performing a program operation of storing data in selected memory cells, among a plurality of memory cells included in a memory block, and a memory controller controlling the memory device to perform a retention control operation of applying a retention control voltage to at least one source line coupled to a plurality of memory cell strings included in the memory block for a predetermined time duration when the program operation is completed.

A method of operating a memory controller controlling a memory device including a plurality of memory blocks may include providing a program command to instruct a program operation of storing data in a selected memory block, among the plurality of memory blocks, and providing the memory device with a retention control operation command to instruct a retention control operation of applying a retention control voltage to at least one source line coupled to a plurality of memory cell strings included in the selected memory block for a predetermined time duration when the program operation is completed.

A memory device may include a memory cell array including a plurality of memory blocks, a peripheral circuit performing a retention control operation on a selected memory block among the plurality of memory blocks, and a control logic controlling the peripheral circuit to apply a retention control voltage having a lower voltage level than an erase voltage applied to at least one source line coupled to the selected memory block when an erase operation of erasing data stored in the selected memory block is performed during the retention control operation.

A memory device may include a memory block including a string having a first memory cell of an erase state and a second memory cell of a program state, a peripheral circuit applying various operation voltages to the string and a control logic controlling, when a program operation is completed to the memory block, the peripheral circuit to prevent electrons from moving between nitride charge trap layers of the first and second memory cells by applying a retention control voltage to a source line of the string for a predetermined time duration.

BRIEF DESCRIPTION OF THE DRAWINGS

FIGS. 6A and 6B are diagrams illustrating a retention control operation according to an embodiment;

FIG. 15 is a flowchart describing operations of a memory device according to an embodiment;

FIG. 16 is a flowchart describing operations of a memory controller according to an embodiment;

DETAILED DESCRIPTION

Figure 1:
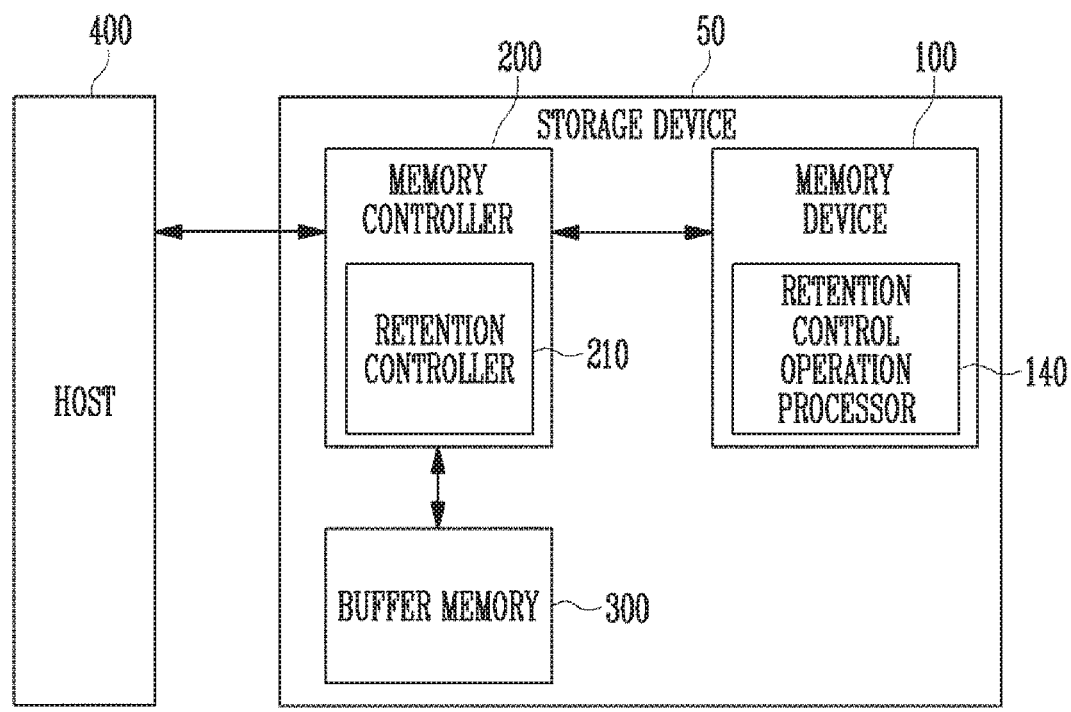
FIG. 1 is a diagram illustrating a storage device according to an embodiment.

Hereinafter, specific structural or functional descriptions of embodiments in accordance with the present invention which are disclosed in this specification are illustrated only to describe the embodiments in accordance with the concepts. The embodiments in accordance with the present invention may be carried out by various forms and the descriptions are not limited to the examples described in this specification. The described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

Various embodiments of the present invention are described below in more detail with reference to the accompanying drawings. We note, however, that the present invention may be embodied in different forms and variations, and should not be construed as being limited to the embodiments set forth herein. That is, various embodiments of the present invention are not limited to those specified, and may also include all changes, equivalents, or substitutes that do not depart from the spirit and technical scope of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Unless specifically stated otherwise, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present invention. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a storage device 50 according to an embodiment.

Referring to FIG. 1, the storage device 50 may include a memory device 100, a memory controller 200, and a buffer memory 300.

The storage device 50 may be configured to store data in response to a host 400. Examples of the storage device 50 may include a cellular phone, a smartphone, an MP3 player, a laptop computer, a desktop computer, a game player, a TV, a tablet PC, or an in-vehicle infotainment system.

The storage device 50 may be manufactured in one of various types of storage units depending on a host interface which is a communication method with the host 400. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e or PCIe) card type storage device, a compact flash (CF) card, a smart media card, a memory stick, and the like.

The storage device 50 may be manufactured in any one of various types of packages. For example, the storage device 50 may be manufactured in any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may be operated under the control of the memory controller 200. The memory device 100 may include a memory cell array (shown in FIG. 2) including a plurality of memory cells storing data. The memory cell array may include a plurality of memory blocks (shown in FIG. 2). Each of the memory blocks may include a plurality of memory cells. Each memory block may include a plurality of pages. According to an embodiment, a page may be a unit for storing data in the memory device 100 or reading data stored in the memory device 100. The memory block may be a unit for erasing data.

By way of example and not limitation, the memory device 100 may be a Double Data Rate Synchronous Dynamic Random Access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random Access Memory (RDRAM), a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM). For convenience of explanation, it may be assumed that the memory device 100 is a NAND flash memory.

According to an embodiment, the memory device 100 may have a two-dimensional or a three-dimensional array structure. The present disclosure may also be applied not only to a flash memory in which a charge storage layer includes a conductive floating gate (FG), but also to a charge trap flash (CTF) memory in which a charge storage layer includes an insulating layer.

According to an embodiment, each of the memory cells included in the memory device 100 may be a single level cell (SLC) storing one data bit. Alternatively, each of the memory cells of the memory device 100 may be configured as a multi-level cell (MLC) for storing two data bits, a triple level cell (TLC) for storing three data bits, or a quad level cell (QLC) for storing four data bits.

The memory device 100 may receive a command and an address from the memory controller 200, and access an area selected in response to the address in the memory cell array. That is, the memory device 100 may perform an operation corresponding to the command on the region selected in response to the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data stored in the area selected by the address.

Threshold voltages of memory cells included in the memory device 100 may change over time. When there are large variations in a threshold voltage distribution, the reliability of data stored in the memory device 100 may be deteriorated. According to an embodiment, the storage device 50 may perform a retention control operation after a program operation of storing data in the memory device 100 is performed. The reliability of the storage device 50 may be improved by performing the retention control operation.

The memory device 100 may include a retention control operation processor 140. The memory controller 200 may control the memory device 100 to perform a retention control operation. During the retention control operation, a positive voltage may be applied to channel regions of the plurality of memory cells included in the memory cell array for a predetermined time duration. For example, the predetermined time duration may be longer than a time duration during which an erase voltage is applied to at least one source line during an erase operation of erasing data stored in a corresponding memory block.

The retention control operation processor 140 may apply a retention control voltage to channel regions of a plurality of memory cell strings included in a selected memory block when receiving a retention control operation command from the memory controller 200.

According to an embodiment, the retention control operation processor 140 may apply, for a predetermined time duration, retention control voltages having different voltage levels to channel regions of the plurality of memory cell strings according to a threshold voltage distribution of the memory cells included in the selected memory block when the retention control operation command is input from the memory controller 200.

According to an embodiment the retention control operation processor 140 may apply a retention control voltage to the channel regions of the plurality of memory cell strings for different time durations according to the threshold voltage distribution of the memory cells included in the selected memory block when the retention control operation command is input from the memory controller 200.

The memory controller 200 may control the general operations of the storage device 50.

When power is applied to the storage device 50, the memory controller 200 may execute firmware FW. When the memory device 100 is a flash memory device, the memory controller 200 may operate firmware such as a Flash Translation Layer (FTL) for controlling communication between the host 400 and the memory device 100.

According to an embodiment, the memory controller 200 may receive data and a logical block address LBA from the host 400 and convert the logical block address LBA into a physical block address PBA indicating an address of memory cells in the memory device 100 in which data is stored. In addition, the memory controller 200 may store a logical-physical address mapping table configuring a mapping relationship between the logical block address LBA and the physical block address PBA in the buffer memory 300.

The memory controller 200 may control the memory device 100 to perform a program operation, a read operation or an erase operation in response to a request from the host 400. During a program operation, the memory controller 200 may provide a program command, the physical block address PBA, and data to the memory device 100. During a read operation, the memory controller 200 may provide a read command and the physical block address PBA to the memory device 100. During an erase operation, the memory controller 200 may provide an erase command and the physical block address PBA to the memory device 100.

According to an embodiment, the memory controller 200 may autonomously generate a program command, an address, and data without receiving a request from the host 400, and transmit them to the memory device 100. For example, the memory controller 200 may provide a command, an address, and data to the memory device 100 to perform background operations, such as a program operation for wear leveling and a program operation for garbage collection.

According to an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store the data input from the host 400 in the buffer memory 300 and may transmit the data temporarily stored in the buffer memory device 300 to the memory device 100.

According to various embodiments, the buffer memory 300 may serve as an operation memory or a cache memory of the memory controller 200. The buffer memory 300 may store codes or commands executed by the memory controller 200. Alternatively, the buffer memory 300 may store data processed by the memory controller 200.

By way of example and not limitation, the buffer memory 300 may include a dynamic random access memory (DRAM), such as Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), or Rambus Dynamic Random Access Memory (RDRAM), or a static random access memory (SRAM).

Although FIG. 1 illustrates that the buffer memory 300 is included in the storage device 50, the present invention is not limited thereto. That is, in an embodiment, the storage device 50 may not include the buffer memory 300. For example, nonvolatile memory devices outside the storage device 50 may function as the buffer memory 300.

According to various embodiments, the buffer memory 300 may be included in the memory controller 200.

According to an embodiment, the memory controller 200 may control at least two memory devices 100. The memory controller 200 may control the memory devices 100 according to an interleaving scheme so as to improve operation performance.

The memory controller 200 may include a retention controller 210. When a program operation is performed on the memory device 100, the retention controller 210 may control the memory device 100 to perform a retention control operation on a memory block including memory cells on which the program operation is performed.

According to an embodiment, the retention controller 210 may determine a voltage level of a retention control voltage according to a threshold voltage distribution of a plurality of memory cells included in a memory block including the memory cells on which the program operation is performed.

According to an embodiment, the retention controller 210 may determine a time duration of applying the retention control voltage to each of the plurality of memory cell strings included in the memory block according to the threshold voltage distribution of the plurality of memory cells included in the memory block including the memory cells on which the program operation is performed.

The host 400 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
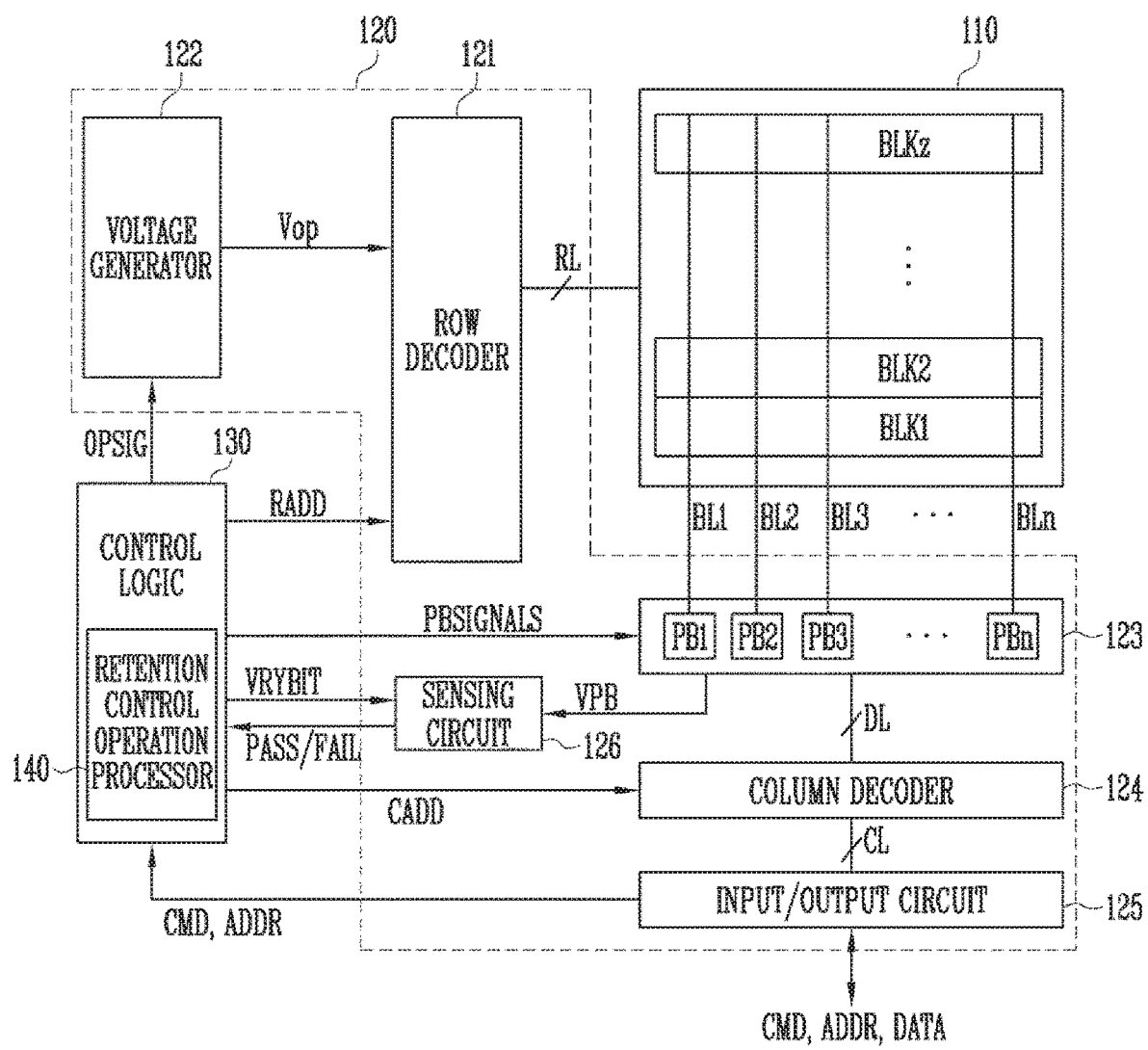
FIG. 2 is a diagram illustrating the structure of a memory device shown in FIG. 1.

FIG. 2 is a diagram illustrating the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a page buffer group 123 through bit lines BL1 to BLn. Each of the plurality of memory blocks BLK1 to BLKz may include a plurality of memory cells. In an embodiment, the plurality of memory cells may be nonvolatile memory cells. Memory cells coupled to the same word line may be defined as one page. Therefore, each memory block may include a plurality of pages.

The row lines RL may include at least one source selection line, a plurality of word lines, and at least one drain selection line.

Each of the memory cells included in the memory cell array 110 may include a single-level cell (SLC) storing a single data bit, a multi-level cell (MLC) storing two data bits, a triple-level cell (TLC) storing three data bits, or a quad-level cell (QLC) storing four data bits.

The peripheral circuit 120 may be configured to perform program, read, and erase operations on the selected area of the memory cell array 110 in response to control of the control logic 130. The peripheral circuit 120 may drive the memory cell array 110. For example, the peripheral circuit 120 may apply various operating voltages to the row lines RL and first to nth bit lines BL1 to BLn, or discharge the applied voltages in response to control of the control logic 130.

The peripheral circuit 120 may include the row decoder 121, a voltage generator 122, the page buffer group 123, a column decoder 124, and an input/output circuit 125, and sensing circuit 126.

The address decoder 121 may be coupled to the memory cell array 110 through the row lines RL. The row lines RL may include at least one source selection line, a plurality of word lines, and at least one drain selection line. In an embodiment, the word lines may include normal word lines and dummy word lines. According to an embodiment, the row lines RL may further include a pipe selection line.

The row decoder 121 may be configured to operate in response to control of the control logic 130. The row decoder 121 may receive a row address RADD from the control logic 130.

The row decoder 121 may be configured to decode the row address RADD. The row decoder 121 may select at least one memory block among the memory blocks BLK1 to BLKz according to the decoded block address. The row decoder 121 may select at least one word line of the selected memory block so as to apply voltages generated by the voltage generator 122 to at least one word line WL according to the decoded address.

For example, during a program operation, the row decoder 121 may apply a program voltage to the selected word line and a program pass voltage having a lower voltage level than the program voltage to unselected word lines. During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

According to an embodiment, an erase operation of the memory device 100 may be performed in units of memory blocks. During an erase operation, the row decoder 121 may select one of the memory blocks according to the decoded address. During the erase operation, the address decoder 121 may apply a ground voltage to word lines coupled to the selected memory block.

The voltage generator 122 may be controlled by the control logic 130. The voltage generator 122 may be configured to generate a plurality of voltages by using an external power voltage supplied to the memory device 100. More specifically, the voltage generator 122 may generate various operating voltages Vop for program, read and erase operations in response to an operation signal OPSIG. For example, the voltage generator 122 may generate a program voltage, a verify voltage, a pass voltage, a read voltage, and an erase voltage in response to the control of the control logic 130.

According to an embodiment, the voltage generator 122 may generate an internal power voltage by regulating an external power voltage. The internal power voltage generated by the voltage generator 122 may be used as an operating voltage of the memory device 100.

According to an embodiment, the voltage generator 122 may generate a plurality of voltages by using an external power voltage or an internal power voltage.

For example, the voltage generator 122 may include a plurality of pumping capacitors receiving the internal power voltage, and may generate a plurality of voltages by selectively activating the plurality of pumping capacitors in response to the control of the control logic 130.

The generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. The first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense voltages or currents in the first to nth bit lines BL1 to BLn during a read or verify operation.

More specifically, during a program operation, the first to nth page buffers PB1 to PBn may transfer the data DATA received through the input/output circuit 125 to selected memory cells through the first to nth bit lines BL1 to BLn when a program pulse is applied to a selected word. Memory cells of a selected page may be programmed according to the transferred data DATA. A memory cell coupled to a bit line to which a program permission voltage (e.g., ground voltage) is applied may have an increased threshold voltage. A threshold voltage of a memory cell coupled to a bit line to which a program inhibition voltage (for example, power voltage) is applied may be maintained. During a program verify operation, the first to nth page buffers PB1 to PBn may read page data from the selected memory cells through the first to nth bit lines BL1 to BLn, respectively.

During a read operation, the first to nth page buffers PB1 to PBn may read the data DATA from the memory cells through the first to nth bit lines BL1 to BLn and output the read data DATA to the input/output circuit 125 in response to control of the column decoder 124.

During an erase operation, the first to nth page buffers PB1 to PBn may float the first to nth bit lines BL1 to BLn, respectively.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through the column lines CL.

The input/output circuit 125 may transfer a command CMD and an address ADD from the memory controller 200 described above with reference to FIG. 1 to the control logic 130, or may exchange the data DATA with the column decoder 124.

A sensing circuit 126 may generate a reference current in response to an allowable bit signal VRYBIT and output a pass signal PASS or a fail signal FAIL by comparing a sensing voltage VPB received from the page buffer group 123 with a reference voltage generated by the reference current during a read operation or a verify operation.

The control logic 130 may control the peripheral circuit 120 by outputting the operation signal OPSIG, the row address RADD, the page buffer control signals PBSIGNALS, and the allowable bit signal VRYBIT in response to the command CMD and the address ADD. In addition, the control logic 130 may determine whether the verify operation passes or fails in response to the pass or fail signal PASS or FAIL.

The control logic 130 may include the retention control operation processor 140. The retention control operation processor 140 may perform a retention control operation on the selected memory block in response to the retention control operation command input from the memory controller 200. During the retention control operation, a retention control voltage may be applied to channel regions of a plurality of memory cell strings included in the selected memory block for a predetermined time duration.

According to an embodiment, the retention control operation processor 140 may perform a channel status read operation to read a channel status of the selected memory block in response to a channel status read command input from the memory controller 200. During the channel status read operation, channel status information indicating channel statuses of the plurality of memory cell strings included in the selected memory block may be obtained. For example, the retention control operation processor 140 may apply a channel status read voltage having the same voltage level to all word lines coupled to the selected memory block. The retention control operation processor 140 may acquire the channel status information by detecting a change in voltage or current in a plurality of bit lines coupled to the selected memory block. The channel status information may indicate channel statuses of the plurality of memory cell strings. The channel status information may indicate the number of memory cells corresponding to an erase state included in each of the plurality of memory cell strings. The retention control operation processor 140 may provide the acquired channel status information to the memory controller 200.

The retention control operation processor 140 may set retention control information in response to control of the memory controller 200. The retention control information may include a voltage level of the retention control voltage used in the retention control operation or a time duration of applying the retention control voltage. The retention control information may be set by a parameter set command provided from the memory controller 200. The retention control operation processor 140 may perform the retention control operation according to the set retention control information.

Figure 3:
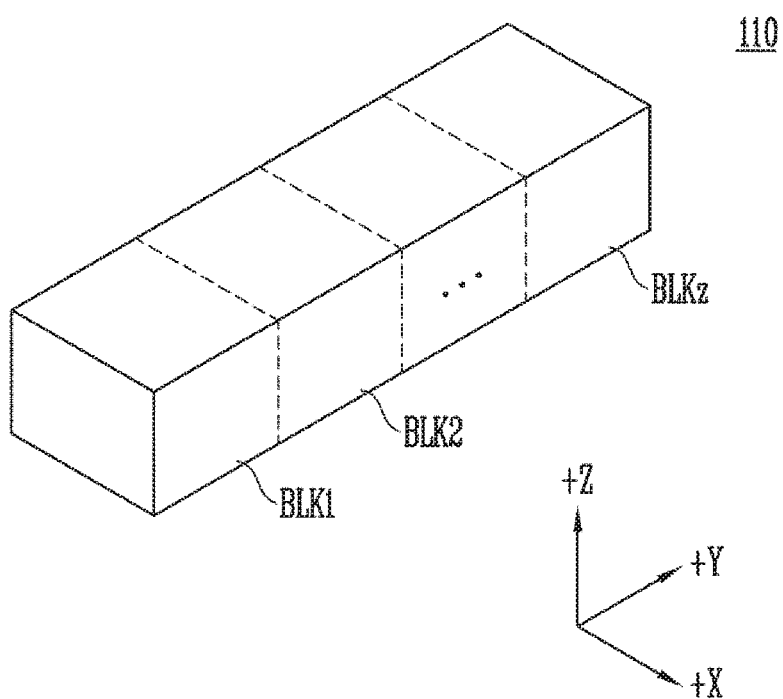
FIG. 3 is a diagram illustrating an embodiment of a memory cell array shown in FIG. 2.

FIG. 3 shows an embodiment of the memory cell array 110 shown in FIG. 2.

Referring to FIG. 3, the memory cell array 110 may include a plurality of memory blocks BLK1 to BLKz. Each of the memory blocks BLK1 to BLKz may have a two-dimensional or a three-dimensional structure. When, as shown in FIG. 3, the memory blocks BLK1 to BLKz have a three-dimensional structure, each memory block BLK1 to BLKz may include a plurality of memory cells stacked on a substrate. The plurality of memory cells may be arranged in +X direction, +Y direction and +Z direction. The structure of each memory block will be described below in detail with reference to FIGS. 4 and 5.

Figure 4:
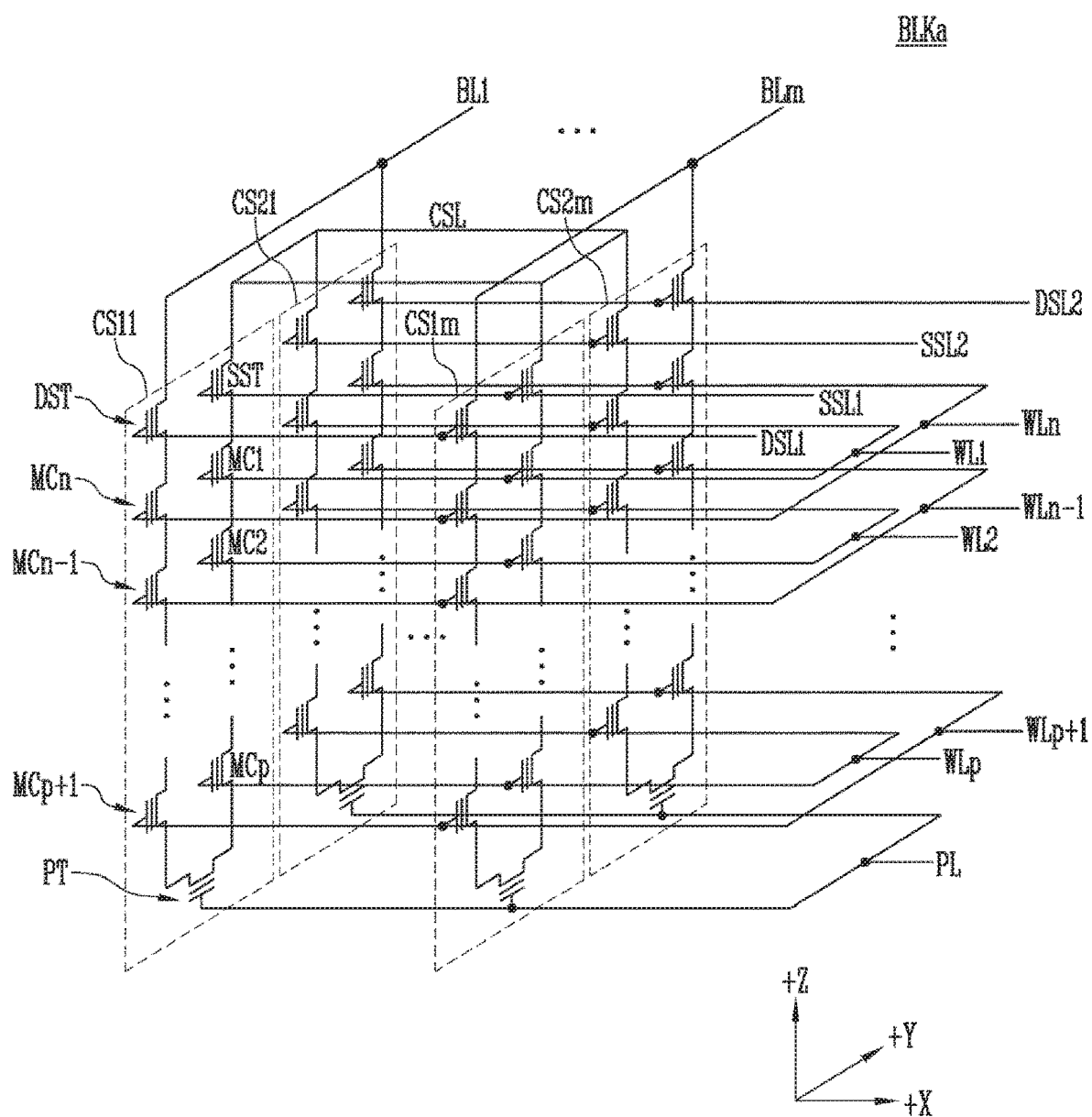
FIG. 4 is a circuit diagram illustrating a memory block BLKa among memory blocks BLK1 to BLKz shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1m and CS21 to CS2m. According to an embodiment, each of the cell strings CS11 to CS1m and CS21 to CS2m may be formed in a U shape. In the memory block BLKa, 'm' cell strings may be arranged in a row direction (i.e., +X direction). In FIG. 4, it is illustrated as an example that two cell strings are arranged in a column direction (i.e., +Y direction). However, the number of cell strings arranged in the column direction may vary depending on design.

Each of the cell strings CS11 to CS1*m* and CS21 to CS2*m* may include at least one source selection transistor SST, first to nth memory cells MC1 to MCn, a pipe transistor PT, and at least one drain selection transistor DST.

Each of the selection transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing the channel layer may be provided in each cell string. According to an embodiment, a pillar for providing at least one of the channel layer, the tunneling insulating layer, the charge storage layer, and the blocking insulating layer may be provided to each cell string.

The source selection transistor SST of each cell string may be coupled between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 4, source selection transistors of the cell strings CS11 to CS1*m* in the first row may be coupled to a first source selection line SSL1. Source selection transistors of the cell strings CS21 to CS2*m* in the second row may be coupled to a second source selection line SSL2.

According to another embodiment, the source selection transistors of the cell strings CS11 to CS1*m* and CS21 to CS2*m* may be coupled in common to one source selection line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source selection transistor SST and the pipe transistor PT. The (p+1)th to nth memory cells MCp+1 to MCn may be sequentially arranged in the +Z direction, and may be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in the row direction may be coupled to a drain selection line extending in the row direction. Drain selection transistors of the cell strings CS11 to CS1*m* in the first row may be coupled to a first drain selection line DSL1. Drain selection transistors of the cell strings CS21 to CS2*m* in the second row may be coupled to a second drain selection line DSL2.

Cell strings arranged in the column direction may be coupled to a bit line extending in the column direction. As illustrated in FIG. 4, the cell strings CS11 and CS21 in the first column may be coupled to the first bit line BL1. The cell strings CS1*m* and CS2*m* in the mth column may be coupled to the mth bit line BLm.

Memory cells coupled to the same word line arranged in cell strings arranged in the row direction may form a single page. For example, memory cells coupled to the first word line WL1 in the cell strings CS11 to CS1*m* in the first row may constitute a single page. Memory cells coupled to the first word line WL1 in the cell strings CS21 to CS2*m* in the second row may constitute another page. When one of the drain selection lines DSL1 and DSL2 is selected, cell strings arranged in one row direction may be selected. When one of the first to nth word lines WL1 to WLn is selected, one page may be selected from selected cell strings.

In another embodiment, even bit lines and odd bit lines may replace the first to mth bit lines BL1 to BLm. In addition, even cell strings of the cell strings CS11 to CS1*m* or CS21 to CS2*m* arranged in the row direction may be coupled to even bit lines, respectively, and odd cell strings of the cell strings CS11 to CS1*m* or CS21 to CS2*m* arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may increase, whereas the size of the memory block BLKa may increase. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
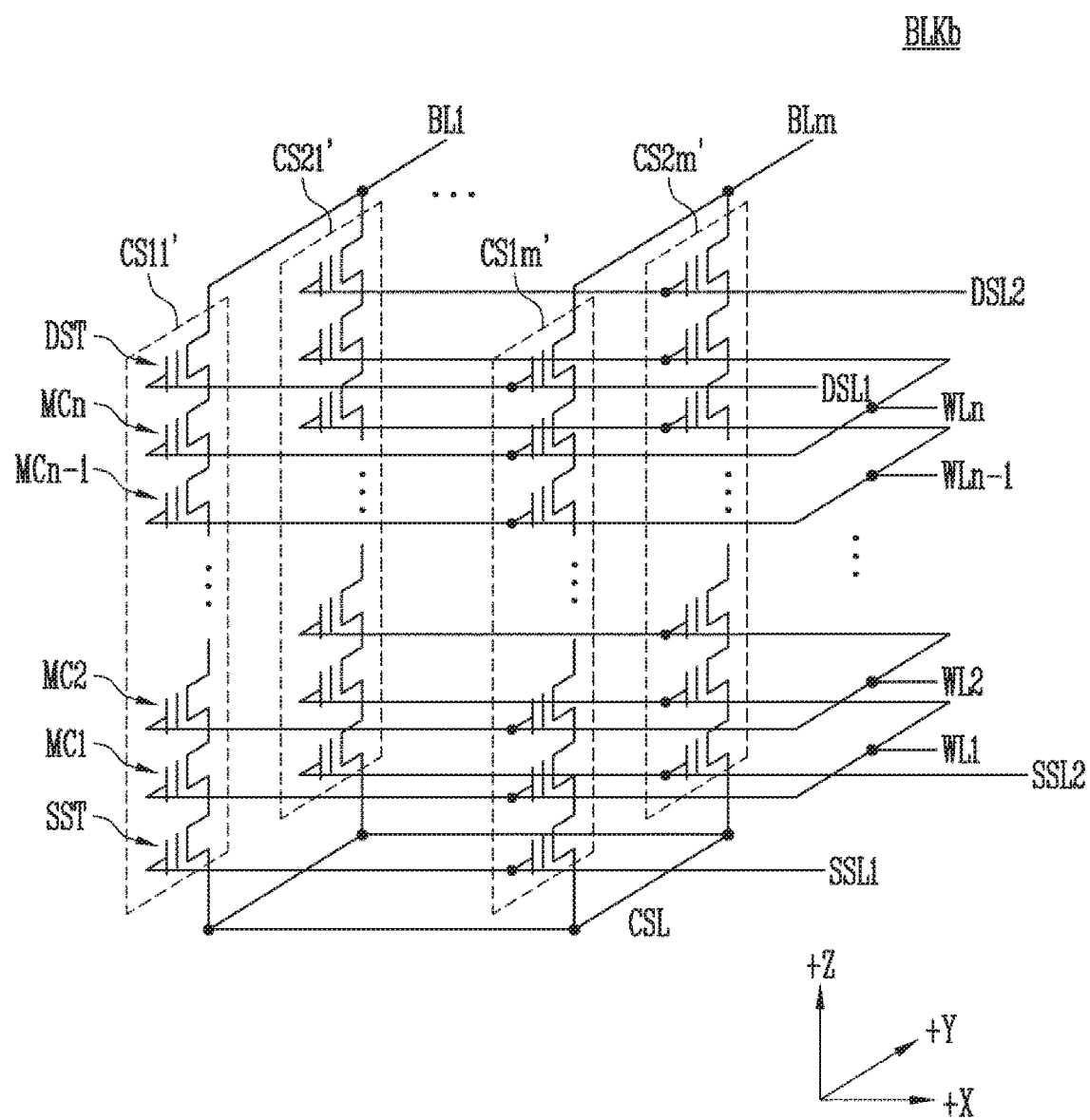
FIG. 5 is a circuit diagram illustrating another embodiment of a memory block BLKb among the memory blocks BLK1 to BLKz shown in FIG. 3.

FIG. 5 is a circuit diagram illustrating another embodiment of a memory block BLKb among the memory blocks BLK1 to BLKz shown in FIG. 3.

Referring to FIG. 5, the memory block BLKb may include a plurality of cell strings CS11' to CS1*m*' and CS21' to CS2*m*'. Each of the plurality of cell strings CS11' to CS1*m*' and CS21' to CS2*m*' may extend in the +Z direction. Each of the plurality of cell strings CS11' to CS1*m*' and CS21' to CS2*m*' may include at least one source select transistor SST, the first to nth memory cells MC1 to MCn, and at least one drain select transistor DST, which are stacked on a substrate (not shown) under the memory block BLK1.

The source select transistor SST of each cell string may be coupled between the common source line CSL and the first to nth memory cells MC1 to MCn. Source selection transistors of cell strings arranged in the same row may be coupled to the same source selection line. Source selection transistors of the cell strings CS11' to CS1*m*' arranged in the first row may be coupled to the first source selection line SSL1. Source select transistors of the cell strings CS21' to CS2m' arranged in the second row may be coupled to the second source select line SSL2. According to another embodiment, the source selection transistors of the cell strings CS11' to CS1m' and CS21' to CS2m' may be coupled in common to one source selection line.

The first to nth memory cells MC1 to MCn of each cell string may be coupled between the source select transistor SST and the drain select transistor DST. Gates of the first to nth memory cells MC1 to MCn may be coupled to the first to nth word lines WL1 to WLn, respectively.

The drain selection transistor DST of each cell string may be coupled between the corresponding bit line and the memory cells MC1 to MCn. Drain selection transistors of cell strings arranged in the row direction may be coupled to a drain selection line extending in the row direction. Drain selection transistors of the cell strings CS11' to CS1m' in the first row may be coupled to the first drain selection line DSL1. The drain select transistors of the cell strings CS21' to CS2m' in the second row may be coupled to the second drain select line DSL2.

As a result, the memory block BLKb shown in FIG. 5 may have a similar t circuit to that of the memory block BLKa shown in FIG. 4. That is, the pipe transistor PT included in each cell string in the memory block BLKa may be excluded in the memory block BLKb.

In another embodiment, even bit lines and odd bit lines may be provided instead of the first to mth bit lines BL1 to BLm. Even cell strings of the cell strings CS11' to CS1m' or CS21' to CS2m' arranged in the row direction may be coupled to the even bit lines, respectively, and odd cell strings of the cell strings CS11' to CS1m' or CS21' to CS2m' arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may increase, whereas the size of the memory block BLKb may increase. When fewer memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

FIGS. 6A and 6B are diagrams illustrating a retention control operation according to an embodiment. Specifically, FIG. 6A illustrates changes in memory cells after completion of a program operation, and FIG. 6B illustrates changes in memory cells during application of retention control voltage.

For convenience of explanation, in FIGS. 6A and 6B, it is assumed that a single memory cell string includes four memory cells. Referring to FIGS. 6A and 6B, the four memory cells included in the memory cell string may have a first program state PV1, an erase state Erase, a fourth program state PV4, and the first program state PV1, respectively, sequentially from the left to the right.

The memory cells may have various threshold voltages depending on the programmed states thereof. More specifically, the memory cell having the erase state Erase may have the lowest threshold voltage. The threshold voltages of the memory cells may gradually increase from the first program state PV1 toward the fourth program state PV4.

A nitride charge trap layer, which is a charge storage layer, may include various amounts of electrons depending on the programmed state of a corresponding memory cell. More specifically, the number of electrons trapped in the nitride charge trap layer may increase as the threshold voltage of the corresponding memory cell increase. As the number of electrons trapped in the nitride charge trap layer increases, the corresponding memory cell may be turned on by a higher voltage applied to its gate node.

Referring to FIG. 6A, in the single memory cell string after a program operation completion (indicated by 601 in FIG. 6A), nitride charge trap layers of the memory cell string may include different numbers of electrons depending on the threshold voltages of the memory cells in the memory cell string. For example, the nitride charge trap layer of the memory cell corresponding to the erase state Erase may have few electrons and holes may be distributed therein. The number of electrons trapped in the nitride charge trap layer of the memory cell programmed into the first program state PV1 may be smaller than the number of electrons trapped in the nitride charge trap layer of the memory cell programmed into the fourth program state PV4.

In a memory cell array having a three-dimensional structure, since nitride charge trap layers of memory cells included in a single memory cell string are coupled to each other, electrons in the nitride charge trap layers may move across each other. Therefore, when memory cells adjacent to the memory cell having the threshold voltage corresponding to the erase state Erase have higher threshold voltages, electrons trapped in nitride charge trap layers of the adjacent memory cells may move toward the nitride charge trap layer of the memory cell having the erase state Erase. In addition, the moved electrons may be combined with holes in the nitride charge trap layer of the memory cell having the erase state Erase. As a result, a threshold voltage of the memory cell having the erase state Erase may increase.

Referring to FIG. 6B, in the single memory cell string during a retention control operation according to an embodiment (indicated by 603 in FIG. 6B), a retention control voltage Vrec may be applied to the channel region of the memory cell string. When the retention control voltage Vrec which is an arbitrary positive voltage is applied to the channel region, electrons trapped in the nitride charge trap layer may move toward a nitride tunneling oxide layer by an electromagnetic force generated from the channel region. For example, the retention control voltage Vrec may have a lower voltage level than an erase voltage applied to at least one source line coupled to the selected memory block when an erase operation of erasing data stored in the selected memory block is performed. As a result, electrons may be blocked from moving toward the nitride charge trap layer of the memory cell having the erase state Erase, so that effects as if a kind of virtual barrier was generated may be produced. Accordingly, the increase in threshold voltage of the memory cell having the erase state Erase may be prevented.

Figure 7:
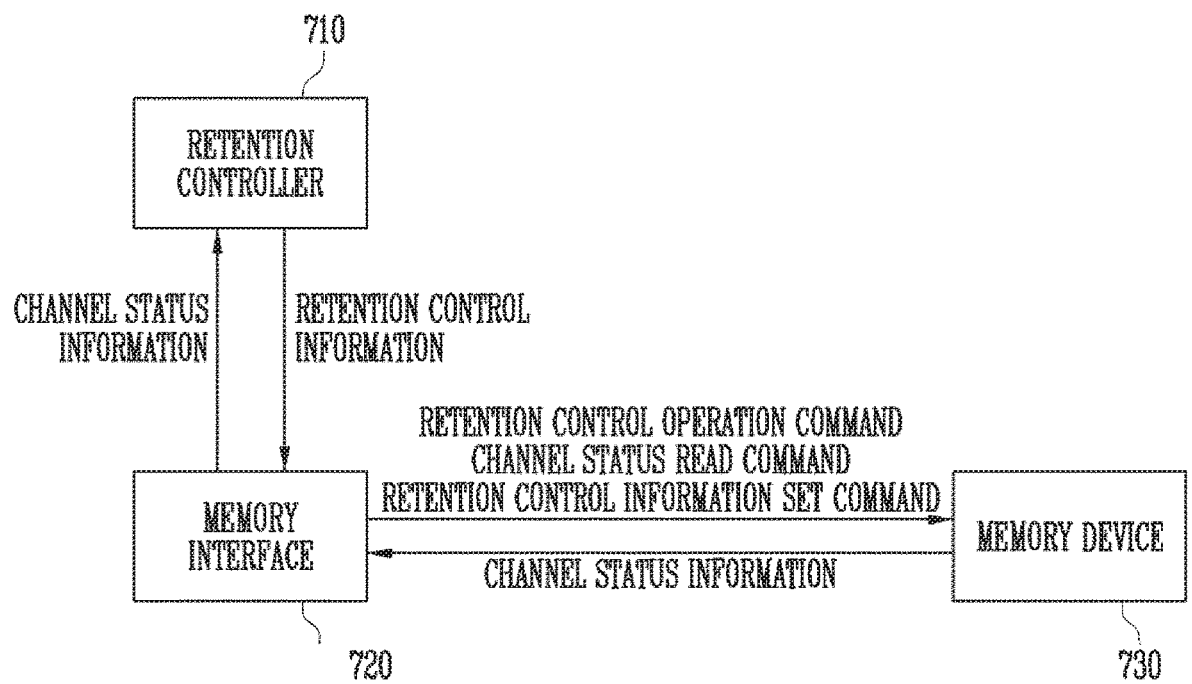
FIG. 7 is a diagram illustrating operations of a retention controller 210 illustrated in FIG. 1.

FIG. 7 is a diagram illustrating operations of the retention controller 210 illustrated in FIG. 1.

A retention controller 710 in FIG. 7 may be the retention controller 210 described above with reference to FIG. 1. A memory interface 720 may be the memory interface 200 described above with reference to FIG. 1. A memory device 730 may be the memory device 100 described above with reference to FIG. 1.

The retention controller 710 may detect completion of a program operation to the memory device 730. The retention controller 710 may not perform a retention control operation when the program operation fails. The retention controller 710 may provide a retention control operation command to the memory device 730 by controlling the memory interface 720 when the program operation passes. The memory device 730 may perform a retention control operation in response to the retention control operation command.

According to an embodiment, the retention controller 710 may provide a channel status read command to the memory device 730 by controlling the memory interface 720 when the program operation passes.

In response to the channel status read command, the memory device 730 may perform a channel status read operation on a selected memory block which includes memory cells on which the program operation is completed. The memory device 730 may provide channel status information obtained through the channel status read operation to the memory interface 720. The memory interface 720 may provide the received channel status information to the retention controller 710.

The retention controller 710 may generate retention control information according to the channel status information. The retention control information may include one or more between a voltage level of a retention control voltage to be applied to the selected memory block and a time duration of applying the retention control voltage. According to an embodiment, the retention control information may include a voltage level of a retention control voltage to be applied to each of the plurality of memory cell strings included in the selected memory block, and a time duration of applying the retention control voltage to each of the memory cell strings.

The retention controller 710 may provide a retention control information set command to the memory device 730 by controlling the memory interface 720 so that the memory device 730 may perform the retention control operation on the basis of the generated retention control information.

Then, the retention controller 710 may provide a retention control operation command to the memory device 730 by controlling the memory interface 720. The memory device 730 may perform a retention control operation according to the set retention control information in response to the retention control operation command.

Figure 8:
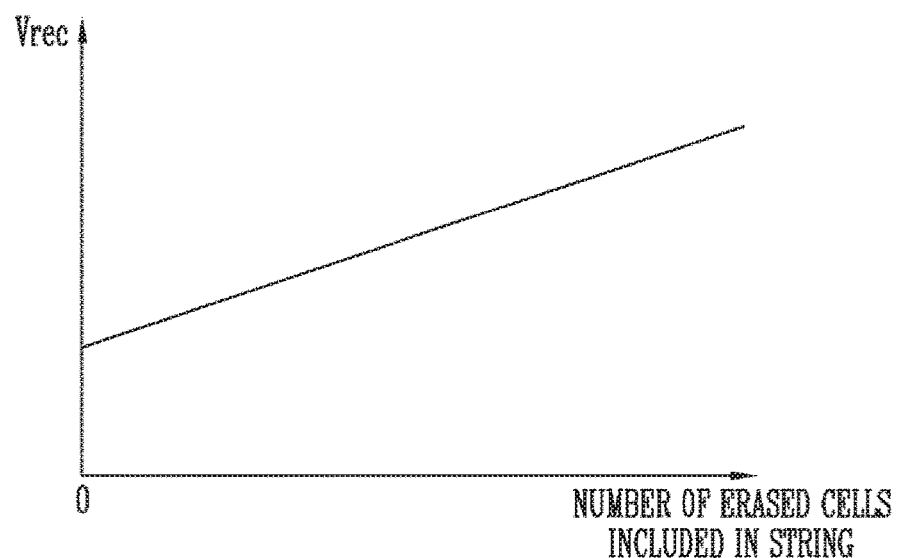
FIG. 8 is a graph illustrating the relationship between a channel status and a voltage level of a retention control voltage.

FIG. 8 is a graph illustrating the relationship between a channel status and a voltage level of a retention control voltage.

Referring to FIG. 8, a horizontal axis may refer to the number of erased memory cells included in a memory cell string, and a vertical axis may refer to the voltage level of the retention control voltage Vrec.

As the number of erased memory cells increases in the memory cell string, the number of erased memory cells having increased threshold voltages may increase. Therefore, as the number of erased memory cells included in the memory cell string increases, a retention control voltage having a higher voltage level may be applied. According to an embodiment, the retention control voltage may have a voltage level from 3 V to 5 V. However, this value is only shown as an example, and the retention control voltage may have a voltage level which does not cause changes in threshold voltages of programmed memory cells.

Figure 9:
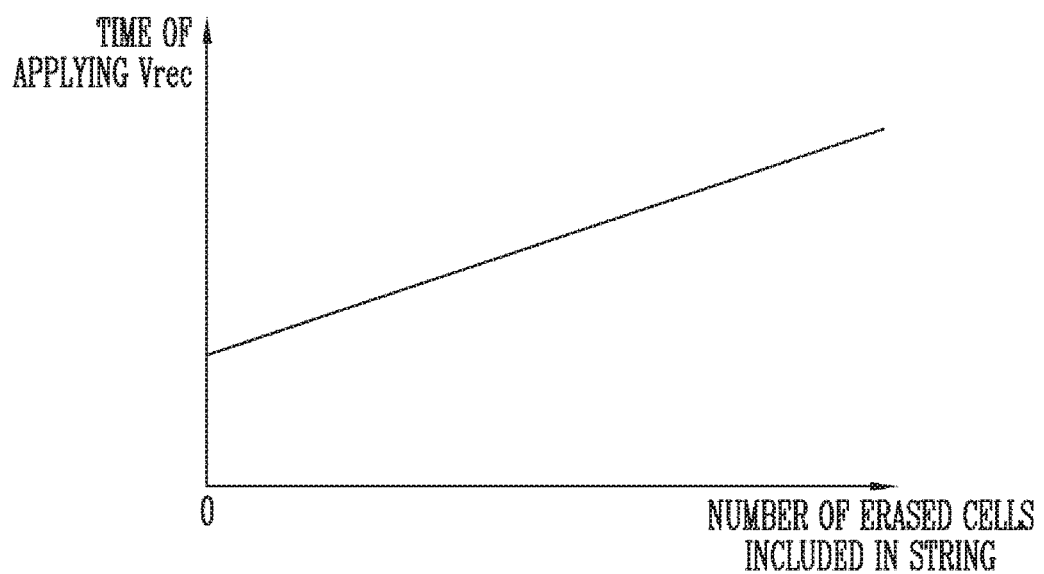
FIG. 9 is a graph illustrating the relationship between a channel status and the time duration of applying a retention control voltage.

FIG. 9 is a graph illustrating the relationship between a channel status and a time duration of applying a retention control voltage.

Referring to FIG. 9, a horizontal axis may refer to the number of erased memory cells included in a memory cell string, and a vertical axis may refer to a time duration of applying the retention control voltage Vrec.

As the number of erased memory cells in the memory cell string increases, the number of erased memory cells and having increased threshold voltages may increase. Therefore, as the number of erased memory cells included in the memory cell string increases, a retention control voltage having the same voltage level may be applied for a longer time duration. According to an embodiment, the time duration of applying the retention control voltage may have a value ranging from 1 ms to 30 ms. However, the present invention is not limited to this range. That is, this value is only an example, and the time duration of applying the retention control voltage Vrec may be any number that is determined not to cause changes in threshold voltages of programmed memory cells.

Figure 10:
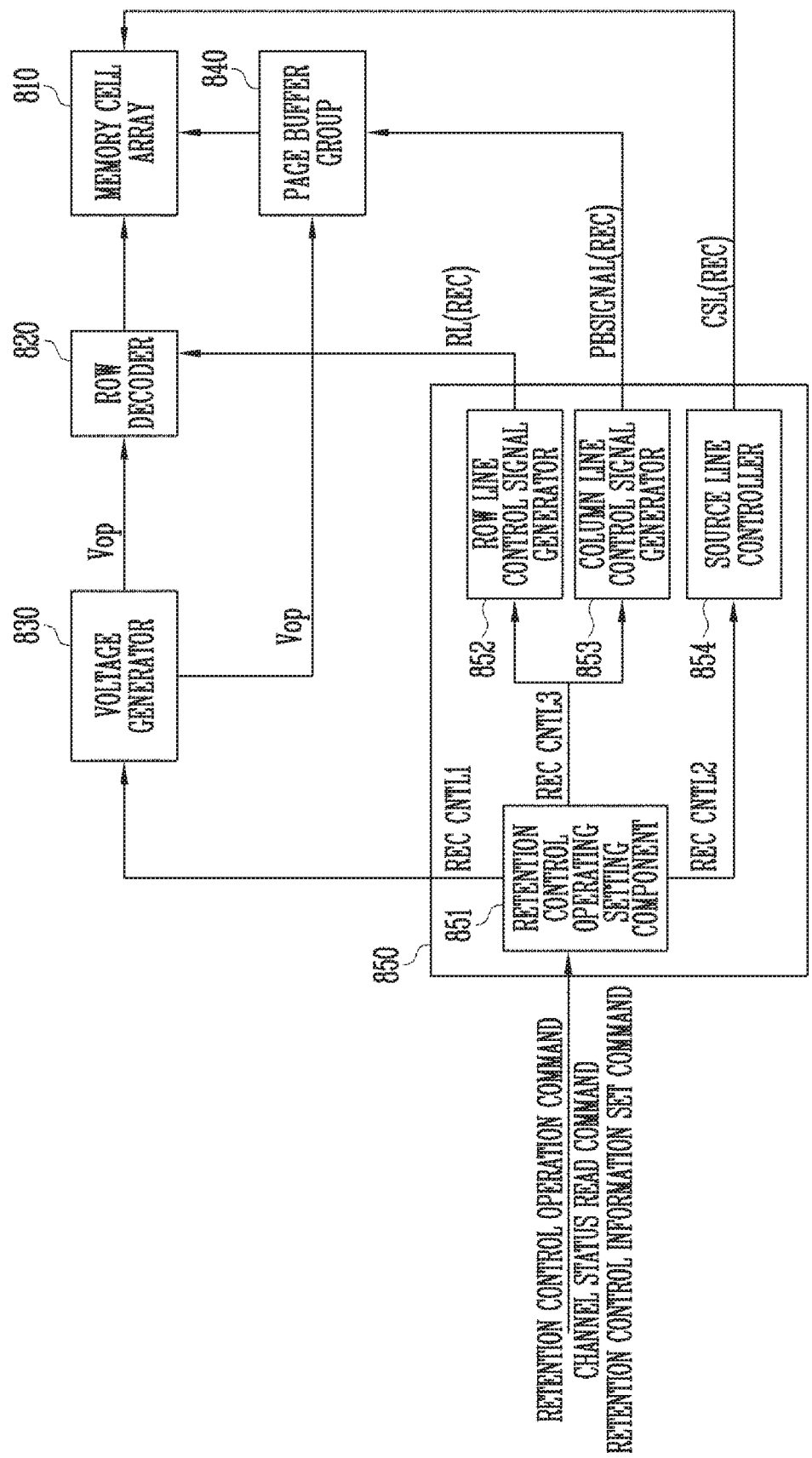
FIG. 10 is a diagram illustrating operations of a retention control operation processor illustrated in FIG. 1.

FIG. 10 is a diagram illustrating operations of the retention control operation processor 140 illustrated in FIG. 1.

Referring to FIG. 10, a memory cell array 810, a row decoder 820, a voltage generator 830, a page buffer group 840, and a retention control operation processor 850 may be the memory cell array 110, the row decoder 121, the voltage generator 122, the page buffer group 123, and the retention control operation processor 140 shown in FIG. 2, respectively.

The retention control operation processor 850 may be included in the control logic 130 described above with reference to FIG. 2.

The retention control operation processor 850 may include a retention control operation setting component 851, a row line control signal generator 852, a column line control signal generator 853, and a source line controller 854.

The retention control operation setting component 851 may control peripheral circuits (i.e., the row decoder 820, the voltage generator 830 and the page buffer group 840) to perform a retention control operation according to a retention control operation command input from the memory controller 200 controlling the memory device 100 (of FIG. 1).

More specifically, the retention control operation setting component 851 may provide a first retention control operation control signal REC CNTL1 to the voltage generator 830 so as to generate operating voltages Vop used in the retention control operation. The voltage generator 830 may generate, according to the first retention control operation control signal REC CNTL1, various operating voltages Vop used to perform the retention control operation. The voltage generator 830 may provide the generated operating voltages Vop to the row decoder 820 and the page buffer group 840. For example, the operating voltages Vop may include a drain selection voltage VDSL, a source selection voltage VSSL and a ground voltage of 0 V, which will be described later with reference to FIGS. 11 and 12.

According to an embodiment, the retention control operation setting component 851 may generate a second retention control operation control signal REC CNTL2 so as to generate a retention control voltage CSL(REC) to be input to the memory cell array 810 through a source line during the retention control operation, and may provide the generated second retention control operation control signal REC CNTL2 to the source line controller 854. A voltage level of the retention control voltage CSL(REC) to be applied to the source line may be determined according to the second retention control operation control signal REC CNTL2. According to an embodiment, the time duration of applying the retention control voltage CSL(REC) to the source line may be determined according to the second retention control operation control signal REC CNTL2. The source line controller 854 may apply the retention control voltage CSL(REC) to the source line of the memory cell array 810 in response to the second retention control operation control signal REC CNTL2.

According to an embodiment, the retention control operation setting component 851 may generate a third retention control operation control signal REC CNTL3 so as to control the operating voltages Vop applied to row lines and bit lines coupled to the memory cell array 810. The retention control operation setting component 851 may provide the generated third retention control operation control signal REC CNTL3 to the row line control signal generator 852 and the column line control signal generator 853.

The row line control signal generator 852 may generate and provide a row line control signal RL(REC) to the row decoder 820 in response to the third retention control operation control signal REC CNTL3. The row decoder 820 may transfer the operating voltages Vop from the voltage generator 830 to the memory cell array 810 in response to the row line control signal RL(REC).

The column line control signal generator 853 may generate and provide the page buffer group 840 with a page buffer control signal PBSIGNAL(REC) for controlling the page buffer group 840 in response to the third retention operation control signal REC CNTL3. The page buffer group 840 may transfer the operating voltages Vop from the voltage generator 830 to bit lines coupled to the memory cell array 810 in response to the page buffer control signal PBSIGNAL(REC).

According to an embodiment, the retention control operation setting component 851 may control the peripheral circuits to perform a channel status read operation according to a channel status read command input from the memory controller 200 controlling the memory device 100.

According to an embodiment, the retention control operation setting component 851 may set retention control information in response to a retention control information set command input from the memory controller 200 that controls the memory device 100. The retention control information may include a voltage level of the retention control voltage CSL(REC) used in the retention control operation or a time duration of applying the retention control voltage CSL(REC) to the source line. The retention control operation setting component 851 may generate the first to third retention control operation control signals REC CNTL1 to CNTL3 according to the set retention control information.

Figure 11:
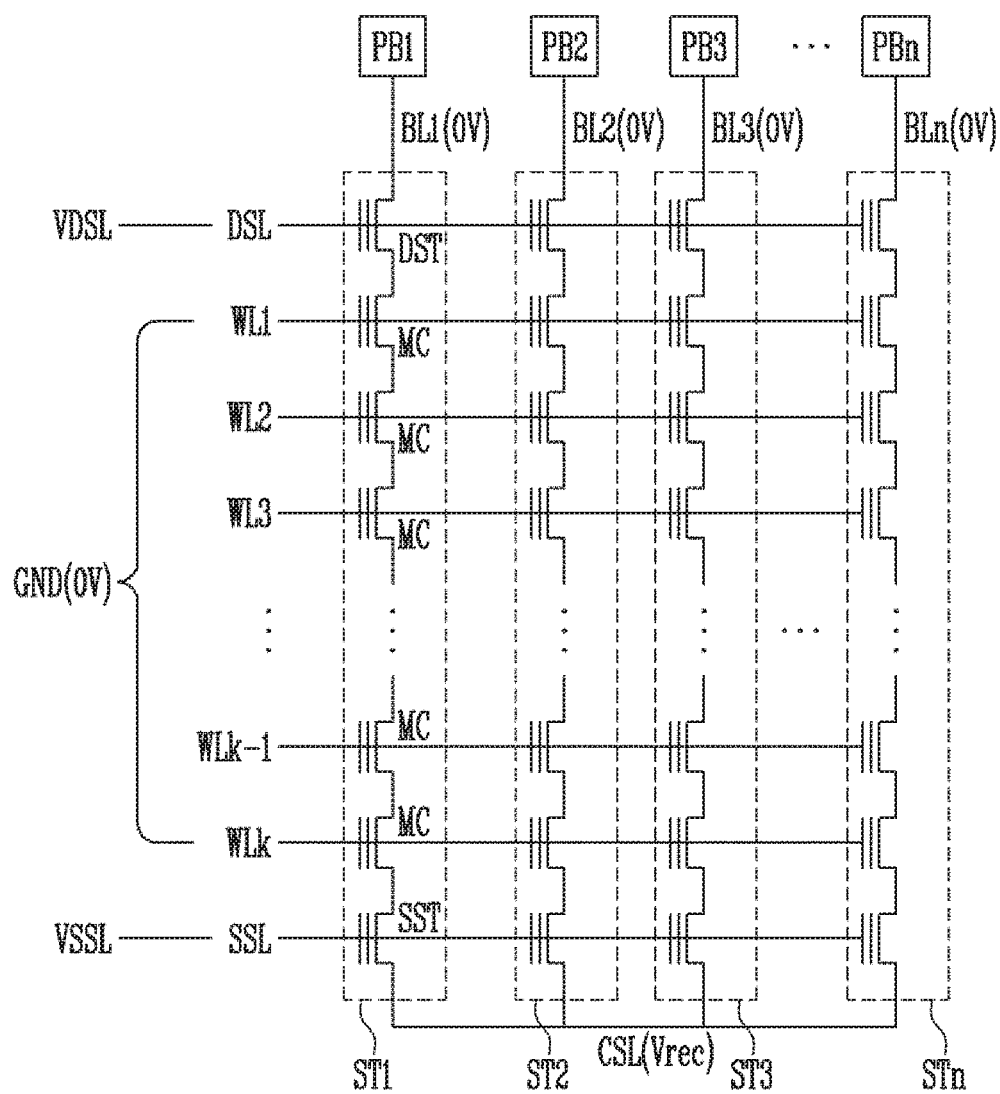
FIG. 11 is a diagram illustrating a retention control operation according to an embodiment.

FIG. 11 is a diagram illustrating a retention control operation according to an embodiment.

Referring to FIG. 11, during a retention control operation, the retention control voltage Vrec may be applied to respective channel regions of memory cell strings ST1 to STn through a common source line for a predetermined time duration. The retention control voltage Vrec may be the same as the retention control voltage CSL(REC) described with reference to FIG. 10 and the common source line may be the source line described with reference to FIG. 10.

During the retention control operation, the retention control voltage Vrec may be applied to the common source line CSL.

A drain selection voltage VDSL may be applied to a drain selection line DSL and a source selection voltage VSSL may be applied to a source selection line SSL. The drain selection voltage VDSL and the source selection voltage VSSL may be applied to turn on the drain selection transistor DST and the source selection transistor SST, respectively.

A ground voltage of 0 V may be applied to word lines WL1 to WLk to which memory cells of the respective memory cell strings ST1 to STn are coupled. The ground voltage of 0 V may also be applied to the bit lines BL1 to BLn to which memory cell strings ST1 to STn are respectively coupled. The retention control voltage Vrec may have a voltage level ranging from 3 V to 5 V. The retention control voltage Vrec may be applied for a time duration ranging from 1 ms to 30 ms.

Figure 12:
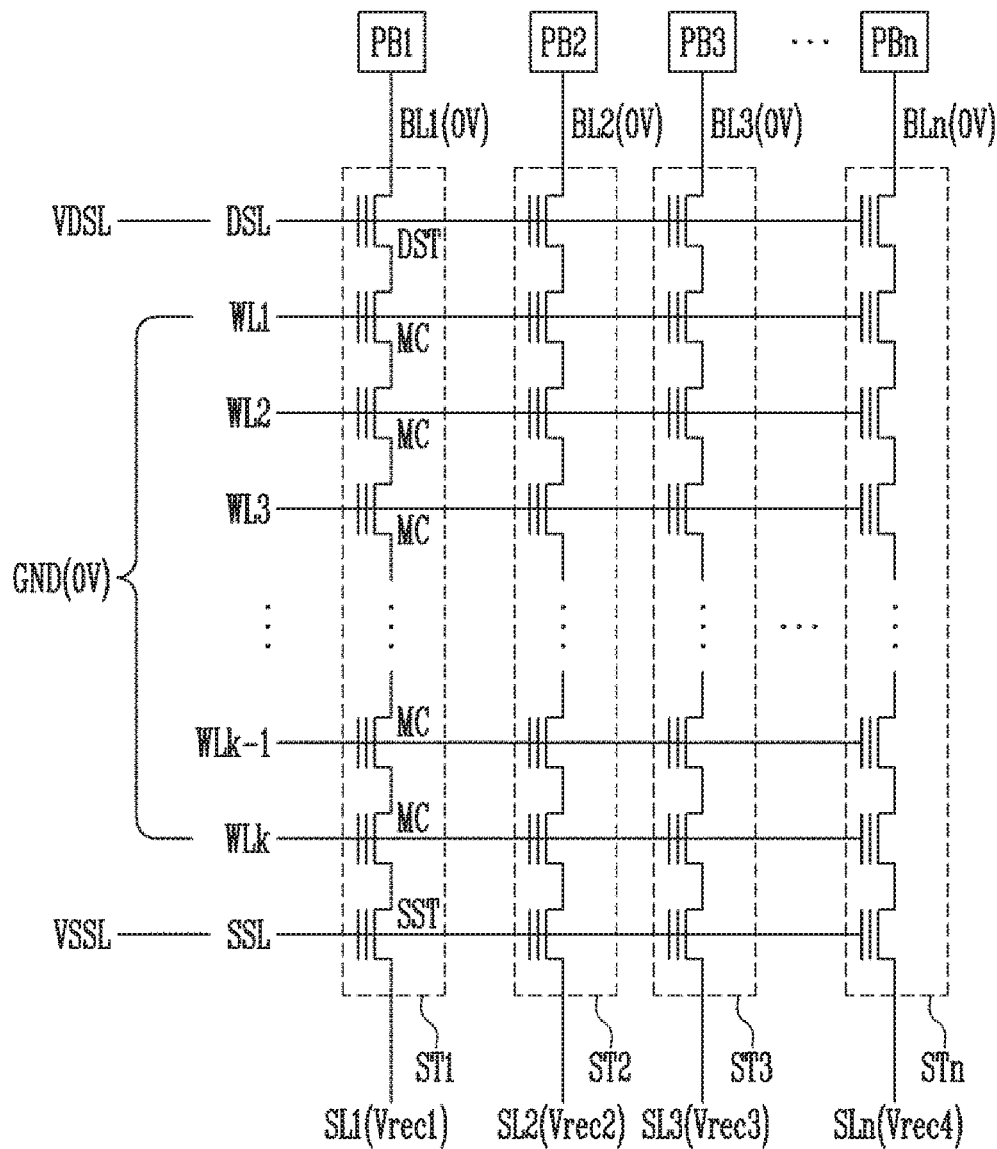
FIG. 12 is a diagram illustrating a retention control operation according to another embodiment.

FIG. 12 is a diagram illustrating a retention control operation according to another embodiment.

Referring to FIG. 12, each of the memory cell strings ST1 to STn may be coupled to each of source lines SL1 to SLn separated from each other. The source lines SL1 to SLn may be included in the source line described with reference to FIG. 10. Retention control voltages Vrec1 to Vrecn may be applied to the source lines SL1 to SLn, respectively. The retention control voltages Vrec1 to Vrecn may be included in the retention control voltage CSL(REC) described with reference to FIG. 10. Unlike the embodiment shown in FIG. 11, the retention control voltages Vrec1 to Vrecn having different voltage levels may be applied to the memory cell strings ST1 to STn.

The drain selection voltage VDSL may be applied to the drain selection line DSL and the source selection voltage VSSL may be applied to the source selection line SSL. The drain selection voltage VDSL and the source selection voltage VSSL may be applied to turn on the drain selection transistor DST and the source selection transistor SST, respectively.

A ground voltage of 0 V may be applied to the word lines WL1 to WLk to which memory cells of the respective memory cell strings ST1 to STn are coupled. The ground voltage of 0 V may also be applied to the bit lines BL1 to BLn to which the memory cell strings ST1 to STn are coupled.

Retention control voltages Vrec1 to Vrecn having different voltage levels may be applied to the first to nth source lines SL1 to SLn to which the first to nth memory cell strings ST1 to STn are respectively coupled. The number of memory cells corresponding to an erase state included in each of the memory cell strings ST1 to STn may vary. Therefore, a voltage level of a retention control voltage to be applied to a channel region of each memory cell string or a time duration of applying the retention control voltage may also vary. Different retention control voltages Vrec1 to Vrecn may be applied to respective memory cell strings ST1 to STn in the memory cell array structure according to the embodiment of FIG. 12. In addition, time durations of applying the retention control voltages Vrec1 to Vrecn to the respective memory cell strings ST1 to STn may vary.

According to an embodiment, the voltage levels of the retention control voltages Vrec1 to Vrecn corresponding to the respective memory cell strings ST1 to STn may be determined according to channel statuses of the respective memory cell strings ST1 to STn. The time durations of applying the retention control voltages Vrec1 to Vrecn corresponding to the respective memory cell strings ST1 to STn may be determined according to the channel statuses of the respective memory cell strings ST1 to STn. The channel statuses of the respective memory cell strings ST1 to STn may be determined by the numbers of erased memory cells included in the respective memory cell strings ST1 to STn.

Figure 13:
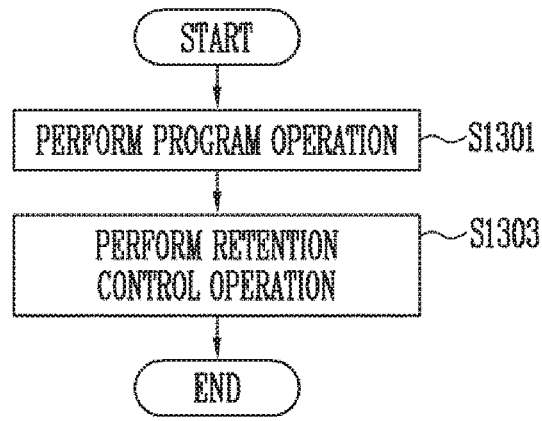
FIG. 13 is a flowchart describing operations of a storage device according to an embodiment.

FIG. 13 is a flowchart describing operations of the storage device 50 according to an embodiment. In describing the operations of the storage device 50, references will be made to FIGS. 1 to 10.

Referring to FIG. 13, at step S1301, the storage device 50 may perform a program operation. More specifically, the storage device 50 may perform the program operation of storing data, for which a write request is made by a host 400, in a memory device 100. The program operation may be performed in units of pages. A memory controller 200 may provide a program command, an address and data to the memory device 100. The memory device 100 may perform the program operation in response to control of the memory controller 200.

At step S1303, the storage device 50 may perform a retention control operation. More specifically, the storage device 50 may perform the retention control operation on a memory block including the page to which the program operation performed at step S1301. For example, the memory controller 200 may provide a retention control operation command to the memory device 100. In response to the retention control operation command provided from the memory controller 200, the memory device 100 may perform the retention control operation on a selected block including the page on which the program operation is performed. The memory device 100 may apply a retention control voltage to a source line to which the selected block is coupled. The memory device 100 may apply a ground voltage to word lines when the retention control voltage is applied. According to an embodiment, the memory device 100 may apply voltages, by which drain selection transistors and source selection transistors are turned on, to drain selection lines and source selection lines. The ground voltage may also be applied to bit lines coupled to the selected block when the retention control voltage is applied.

Figure 14:
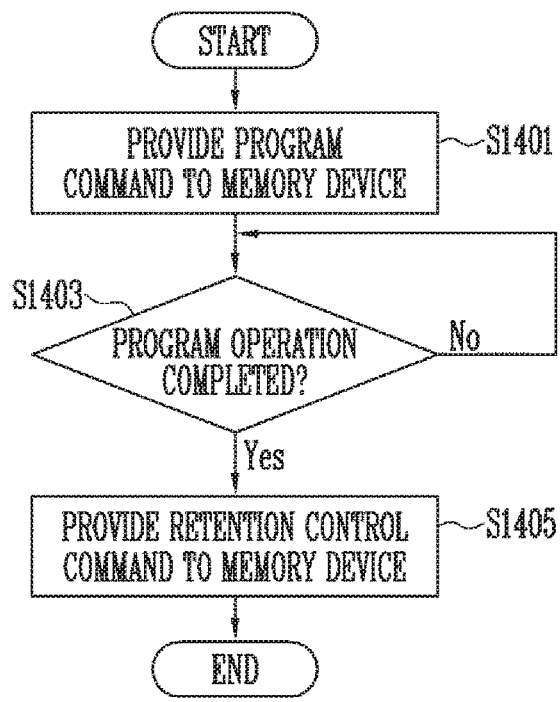
FIG. 14 is a flowchart describing operations of a memory controller according to an embodiment.

FIG. 14 is a flowchart describing operations of the memory controller 200 according to an embodiment. In describing the operations of the memory controller 200, references will be made to FIGS. 1 to 10.

Referring to FIG. 14, at step S1401, the memory controller 200 may provide a program command to a memory device 100. According to an embodiment, the memory controller 200 may provide an address corresponding to a page to be programmed and data to program as well as the program command.

At step S1403, the memory controller 200 may determine whether a program operation is completed. More specifically, the memory controller 200 may provide a status read command to the memory device 100. The status read command may be for requesting status information stored in a status register included in the memory device 100. The memory device 100 may store pass information indicating whether a program operation passes or not (i.e., failed) in the status register when the program operation is completed. The memory device 100 may provide the status information stored in the status register to the memory controller 200 in response to the status read command. The memory controller 200 may determine whether the program operation is completed according to the status information.

At step S1405, the memory controller 200 may provide a retention control operation command to the memory device 100. The retention control operation command may instruct to perform a retention control operation on a selected memory block to which the program operation is performed. During the retention control operation, the memory device 100 may apply a retention control voltage to the selected memory block for a predetermined time duration.

FIG. 15 is a flowchart showing operations of the memory device 100 according to an embodiment. In describing the operations of the memory device 100, references will be made to FIGS. 1 to 10.

Referring to FIG. 15, at step S1501, the memory device 100 may receive a retention control command from a memory controller 200.

At step S1503, the memory device 100 may apply a retention control voltage to a source line coupled to a selected memory block for a predetermined time duration in response to a retention control command.

FIG. 16 is a flowchart showing operations of the memory controller 200 according to an embodiment. In describing the operations of the memory controller 200, references will be made to FIGS. 1 to 10.

Referring to FIG. 16, at step S1601, a memory controller 200 may provide a program command to a memory device 100. According to an embodiment, the memory controller 200 may provide an address corresponding to a page to be programmed and data to program as well as the program command.

At step S1603, the memory controller 200 may determine whether a program operation is completed. More specifically, the memory controller 200 may provide a status read command to the memory device 100. The status read command may be for requesting status information stored in a status register included in the memory device 100. The memory device 100 may store pass information indicating whether the program operation passes or not (i.e., failed) in the status register when the program operation is completed. The memory device 100 may provide the status information stored in the status register to the memory controller 200 in response to the status read command. The memory controller 200 may determine whether the program operation is completed according to the status information.

At step S1605, the memory controller 200 may provide a channel status read command to the memory device 100. The memory device 100 may read channel statuses of a plurality of memory cell strings included in the selected memory block in response to the channel status read command. More specifically, the memory device 100 may apply a channel status read voltage to a word line and acquire data sensed through bit lines. The channel status read voltage may refer to a read voltage by which erased memory cells included in the selected memory block are sensed. Data read according to the channel status read voltage may be channel status information. The channel status information may include information regarding the number of memory cells having an erase state included in each memory cell string.

At step S1607, the memory controller 200 may acquire channel status information from the memory device 100.

At step S1609, the memory controller 200 may determine a voltage level of a retention control voltage to be applied to each memory cell string and a time duration of applying the retention control voltage on the basis of the channel status information. As more erased memory cells are included, a voltage level of a retention control voltage to be applied to a channel of a memory cell string may increase. As more erased memory cells are included, a time duration of applying the retention control voltage to be applied to the channel of the memory cell string may increase. The memory controller 200 may provide the set voltage level of the retention control voltage and the set time duration of applying the retention control voltage to the memory device. For example, the memory controller 200 may set retention control information including the voltage level of the retention control voltage and the time duration of applying the retention control voltage by using a parameter set command SET PARAMETER.

At step S1611, the memory controller 200 may provide a retention control command to the memory device 100 so that a retention control operation may be performed on a set memory block.

Figure 17:
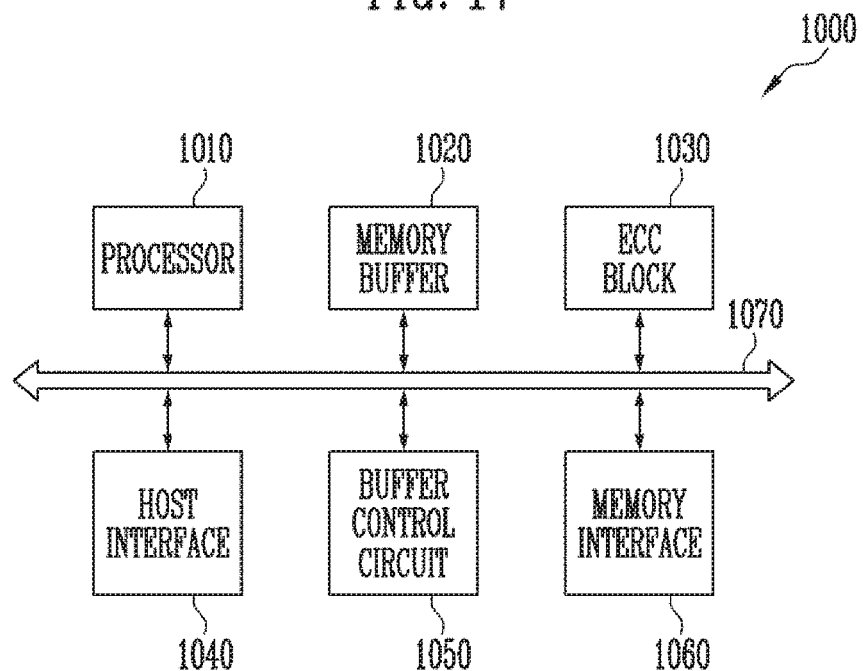
FIG. 17 is a diagram illustrating another embodiment of a memory controller of FIG. 1.

FIG. 17 is a diagram illustrating another embodiment of the memory controller 200 of FIG. 1.

A memory controller 1000 may be coupled to a host and a memory device, for example, the host 400 and the memory device 100 of FIG. 1. In response to a request from the host, the memory controller 1000 may access the memory device. For example, the memory controller 1000 may be configured to control write, read, erase, and background operations of the memory device. The memory controller 1000 may provide an interface between the memory device and the host. The memory controller 1000 may be configured to drive firmware for controlling the memory device.

Referring to FIG. 17, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the flash translation layer FTL. The flash translation layer FTL may receive and translate the logical block address LBA into the physical block address PBA by using a mapping table. There may be various address mapping methods for the flash translation layer FTL, depending on a mapping unit. Typical address mapping methods may include a page mapping method, a block mapping method, and a hybrid mapping method.

The processor 1010 may randomize data received from the host. For example, the processor 1010 may use a randomizing seed to randomize data received from the host. The randomized data as data to be stored may be provided to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

According to an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 may not include the memory buffer 1020 and the buffer control circuit 1050.

For example, the processor 1010 may control the operation of the memory controller 1000 using codes. The processor 1010 may load codes from a nonvolatile memory device (e g, ROM) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 18:
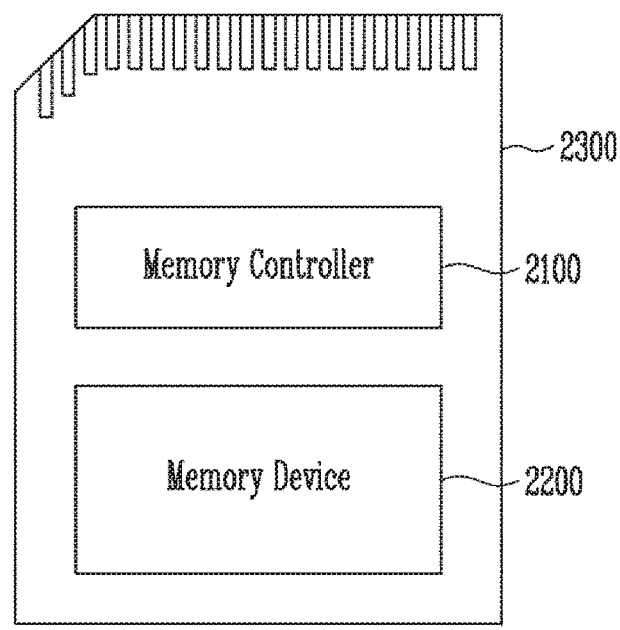
FIG. 18 is a block diagram illustrating a memory card system to which a storage device according to an embodiment is applied.

FIG. 18 is a block diagram illustrating a memory card system 2000 to which a storage device according to an embodiment is applied.

Referring to FIG. 18, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory device 2100 may have the same configuration as the memory device 200 described above with reference to FIG. 1.

In an embodiment, the memory controller 2100 may include components, such as a Random Access Memory (RAM), a processor, a host interface, a memory interface, and an ECC block.

The memory controller 2100 may communicate with an external device through the connector 2300. The controller 2100 may communicate with an external device (e.g., host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication protocols.

In an embodiment, the memory device 2200 may be implemented as one of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-M RAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

Figure 19:
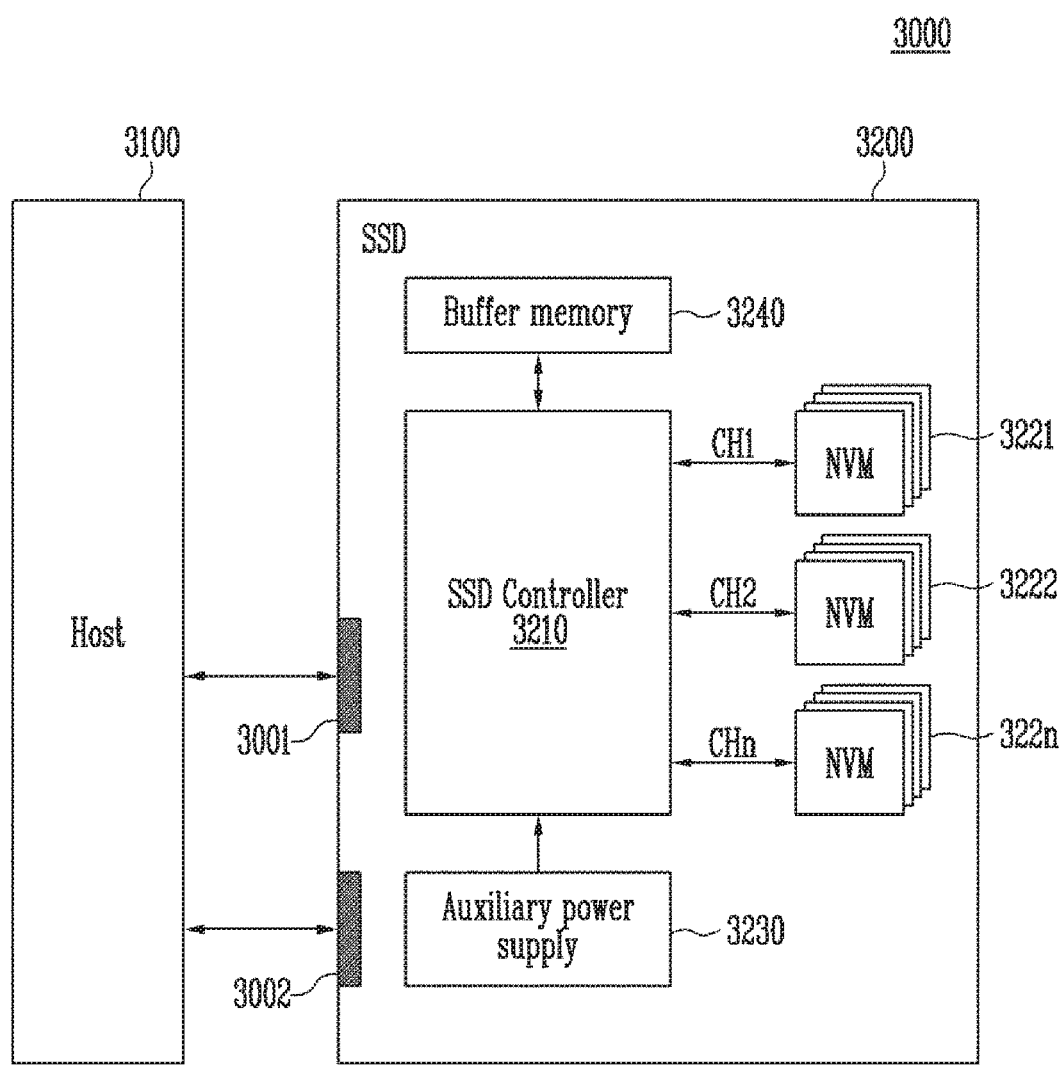
FIG. 19 is a block diagram illustrating an example of a solid state drive (SSD) system to which a storage device according to an embodiment is applied.

FIG. 19 is a block diagram illustrating an example of a solid state drive (SSD) system 300 to which a storage device according to an embodiment is applied.

Referring FIG. 19, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied and charged with power PWR from the host 3100. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e g, mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-M RAM, and PRAM.

Figure 20:
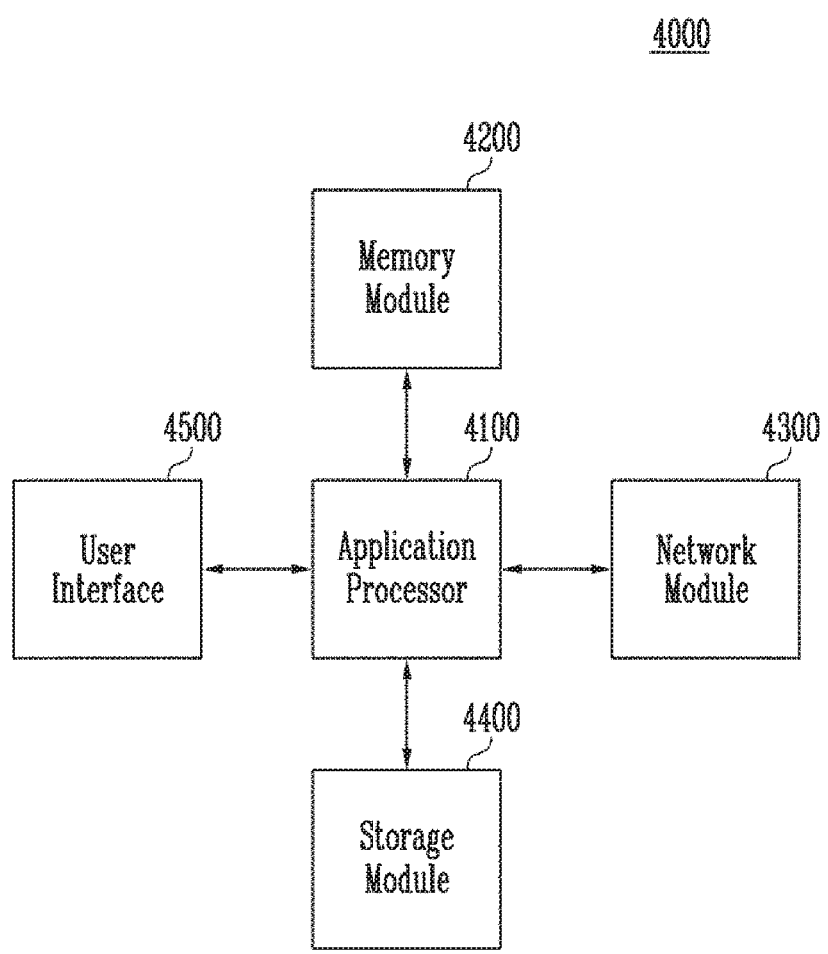
FIG. 20 is a block diagram illustrating a user system to which a storage device according to an embodiment is applied.

FIG. 20 is a block diagram illustrating a user system to which a storage device according to an embodiment is applied.

Referring to FIG. 20, a user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or nonvolatile RAMs such as PRAM, ReRAM, MRAM, and FRAM. In an embodiment, the application processor 4100 and the memory module 4200 may be packaged based on package-on-package (POP) and provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be embodied as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, and the plurality of nonvolatile memory devices may be operated in the same manner as the memory device 100 described above with reference to FIGS. 2 to 5. For example, the storage module 4400 may be operated in the same manner as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

Embodiments of the present invention provide a storage device including a memory device having improved reliability and an operating method thereof.

It will be apparent to those skilled in the art that various modifications can be made to the above-described exemplary embodiments of the present invention without departing from the spirit or scope of the invention.

Thus, it is intended that the present invention cover all such modifications provided they come within the scope of the appended claims and their equivalents.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A storage device, comprising:
    a memory device performing a program operation of storing data in selected memory cells, among a plurality of memory cells included in a memory block; and
    a memory controller controlling the memory device to perform a retention control operation of applying a retention control voltage to at least one source line coupled to a plurality of memory cell strings included in the memory block for a predetermined time duration in response to completion of the program operation,
    wherein the plurality of memory cell strings include the plurality of memory cells coupled in series between a plurality of bit lines and the at least one source line, and
    wherein a ground voltage is applied to the plurality of bit lines while the retention control voltage is applied to the at least one source line.

2. The storage device of claim 1, wherein the memory device includes:
    a peripheral circuit; and
    a retention control operation processor generating control signals for controlling the peripheral circuit to perform the retention control operation in response to a retention control operation command provided from the memory controller.

3. The storage device of claim 2, wherein the retention control operation processor controls the peripheral circuit to perform the retention control operation by applying the ground voltage to word lines coupled to the plurality of memory cells when the retention control voltage is applied to the at least one source line.

4. The storage device of claim 1, wherein the predetermined time duration is longer than a time duration during which an erase voltage is applied to the at least one source line during an erase operation of erasing data stored in the memory block.

5. The storage device of claim 1, wherein the memory controller includes a retention controller controlling the memory device to generate retention control information including the predetermined time duration and a voltage level of the retention control voltage according to channel statuses of the plurality of memory cell strings, and to perform the retention control operation according to the retention control information when the program operation is completed.

6. The storage device of claim 5,
    wherein the retention controller provides a channel status read command for requesting channel status information indicating the channel statuses of the plurality of memory cell strings to the memory device when the program operation is completed, and
    wherein the memory device obtains the channel status information determined by a number of erased memory cells included in each of the plurality of memory cell strings and provides the channel status information to the memory controller in response to the channel status read command.

7. The storage device of claim 6, wherein the retention controller generates the retention control information including the voltage level of the retention control voltage to be applied to the at least one source line on the basis of the channel status information.

8. The storage device of claim 7, wherein the voltage level of the retention control voltage increases as the number of erased memory cells increases.

9. The storage device of claim 6, wherein the retention controller generates the retention control information including the predetermined time duration on the basis of the channel status information.

10. The storage device of claim 9, wherein the predetermined time duration increases as the number of erased memory cells increases.

11. The storage device of claim 5, wherein the retention controller provides a retention control operation command to instruct the memory device to perform the retention control operation after providing the retention control information to the memory device.

12. A method of operating a memory controller controlling a memory device including a plurality of memory blocks, the method comprising:
   providing a program command to instruct a program operation of storing data in a selected memory block, among the plurality of memory blocks; and
   providing the memory device with a retention control operation command according to channel status information acquired from the memory device,
   wherein the retention control operation command is a command to instruct a retention control operation of applying a retention control voltage to at least one source line coupled to a plurality of memory cell strings included in the selected memory block for a predetermined time duration in response to completion of the program operation.

13. The method of claim 12, wherein the providing of the memory device with the retention control operation command comprises:
   providing a channel status read command for requesting the channel status information indicating channel statuses of the plurality of memory cell strings included in the selected memory block to the memory device;
   obtaining the channel status information determined by a number of erased memory cells included in each of the plurality of memory cell strings from the memory device; and
   generating retention control information including the predetermined time duration and a voltage level of the retention control voltage to be applied to the at least one source line on the basis of the channel status information.

14. The method of claim 13, wherein the voltage level of the retention control voltage increases as the number of erased memory cells increases.

15. The method of claim 13, wherein the predetermined time duration increases as the number of erased memory cells increases.

16. The method of claim 13, wherein the providing of the memory device with the retention control operation command further comprises:
   providing the retention control information to the memory device; and
   providing the retention control operation command to the memory device.

17. A memory device, comprising:
   a memory cell array including a plurality of memory blocks;
   a peripheral circuit performing a retention control operation on a selected memory block among the plurality of memory blocks; and
   a control logic controlling the peripheral circuit to apply a retention control voltage having a lower voltage level than an erase voltage applied to at least one source line coupled to the selected memory block when an erase operation of erasing data stored in the selected memory block is performed during the retention control operation,
   wherein the control logic controls the peripheral circuit to apply the retention control voltage to the at least one source line for a longer time duration than a time duration during which the erase voltage is applied to the at least one source line when an erase operation of erasing data stored in the memory block is performed during the retention control operation.

* * * * *